(12) United States Patent
Chang

(10) Patent No.: US 7,671,685 B2
(45) Date of Patent: Mar. 2, 2010

(54) METHOD AND SYSTEM FOR A LOW POWER FULLY DIFFERENTIAL NOISE CANCELLING LOW NOISE AMPLIFIER

(75) Inventor: Yuyu Chang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 102 days.

(21) Appl. No.: 11/694,266

(22) Filed: Mar. 30, 2007

(65) Prior Publication Data

US 2008/0136521 A1 Jun. 12, 2008

Related U.S. Application Data

(60) Provisional application No. 60/868,818, filed on Dec. 6, 2006.

(51) Int. Cl.
*H03F 3/04* (2006.01)

(52) U.S. Cl. .............................. 330/301; 330/117
(58) Field of Classification Search ................ 330/301, 330/116, 117
See application file for complete search history.

(56) References Cited

U.S. PATENT DOCUMENTS

| | | | |
|---|---|---|---|
| 5,901,002 A * | 5/1999 | Bonaccio ..................... 360/46 |
| 6,124,727 A * | 9/2000 | Bridgewater et al. .......... 326/33 |
| 6,400,224 B2 * | 6/2002 | Gharpurey ................... 330/252 |
| 6,441,688 B1 * | 8/2002 | Lau et al. .................... 330/301 |
| 6,606,002 B1 * | 8/2003 | Vice et al. ................... 330/301 |
| 6,819,182 B2 * | 11/2004 | Sibrai ......................... 330/288 |
| 7,224,231 B2 * | 5/2007 | Wu ............................ 330/301 |
| 7,233,209 B2 * | 6/2007 | Braier et al. ................. 330/301 |
| 2006/0164171 A1 * | 7/2006 | Wu ............................ 330/301 |

* cited by examiner

*Primary Examiner*—Henry K Choe
(74) *Attorney, Agent, or Firm*—McAndrews, Held & Malloy, Ltd.

(57) ABSTRACT

Aspects of a method and system for a low power fully differential noise canceling low noise amplifier (NC LNA) are provided. The NC LNA may receive signals via a single ended input and may generate an amplified symmetric differential output from the received signals. The NC LNA may utilize capacitor dividers, such as a capacitor bank, in the single ended input in order to provide impedance transformation that enables low power operation and matching to an input port. The NC LNA may generate one portion of the amplified symmetric differential output via a voltage divider, which may comprise a plurality of capacitors, such as a capacitor bank. The NC LNA may be implemented utilizing one or more circuits.

18 Claims, 6 Drawing Sheets

METHOD AND SYSTEM FOR A LOW POWER FULLY DIFFERENTIAL NOISE CANCELLING LOW NOISE AMPLIFIER

CROSS-REFERENCE TO RELATED APPLICATIONS/INCORPORATION BY REFERENCE

This patent application makes reference to, claims priority to and claims benefit from U.S. Provisional Patent Application Ser. No. 60/868,818, filed on Dec. 6, 2006.

The above referenced application is hereby incorporated herein by reference in its entirety.

FIELD OF THE INVENTION

Certain embodiments of the invention relate to signal processing. More specifically, certain embodiments of the invention relate to a method and system for a low power fully differential noise canceling low noise amplifier.

BACKGROUND OF THE INVENTION

As mobile, wireless, and/or handheld portable devices increasingly become multifunctional, "all-in-one," communication devices, these handheld portable devices integrate an increasingly wide range of functions for handling a plurality of wireless communication services. For example, a single handheld portable device may enable Bluetooth communications and wireless local area network (WLAN) communications.

Much of the front end processing for wireless communications services is performed in analog circuitry. Front end processing within a portable device may comprise a range of operations that involve the reception of radio frequency (RF) signals, typically received via an antenna that is communicatively coupled to the portable device. Receiver tasks performed on an RF signal may include low noise amplification, demodulation, filtering, and analog to digital conversion (ADC), for example. Noise considerations may be important since the strength of the received RF signal may be low. The resulting front-end processed signal may be referred to as a baseband signal. The baseband signal typically contains digital data, which may be subsequently processed in digital circuitry within the portable device.

The operation of low noise amplifiers and other components of the receiver may have to be very linear, that is, the output has to have a linear relationship with the input, to maintain the performance of the receiver. This may cause increased power consumption by the receiver due to the highly linear characteristics of various components in the receiver. Blocker signals are unwanted signals in frequency channels outside the wanted channel that disturb the reception of the wanted signals. This happens due to the fact that the blockers generate large signals within the receiver path. These large signals may introduce harmonics and intermodulation products or unwanted mixing products that crosstalk with the wanted signals. Similarly, when the required RF signal is weak, there is an increase in the power consumption of the receiver to achieve a good noise factor (NF) and a good phase noise. In handheld communication devices such as cell phones, and smart phones, the increased power consumption may significantly drain the battery that powers these devices.

For high performance receivers it is therefore important that the low noise amplifier is able to operate at low power, to perform low noise amplification, to provide reasonably high voltage gain, and to provide good input impedance matching. In this regard, novel low noise amplifier designs may need to achieve all these benefits while being able to generate output signals that may be easily utilized by subsequent processing portions of the receiver.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for a low power fully differential noise canceling low noise amplifier, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a low power fully differential noise canceling low noise amplifier (NC LNA). The NC LNA may receive signals via a single ended input and may generate an amplified symmetric differential output from the received signals. The NC LNA may utilize capacitors dividers, such as a capacitor bank, in the single ended input in order to provide impedance transformation that enables low power operation and matching to an input port. The NC LNA may generate one portion of the amplified symmetric differential output via a voltage divider, which may comprise a plurality of capacitors, such as a capacitor bank. The NC LNA may be implemented utilizing one or more circuits.

Figure 1A:
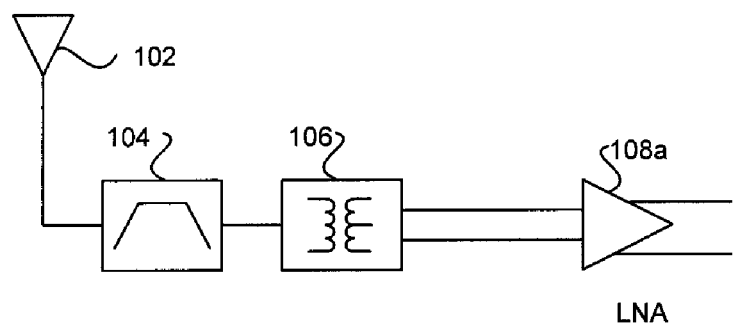
FIG. 1A is a block diagram illustrating an exemplary differential input asymmetric differential output LNA receiving signals from an antenna via a filter and a balun, in connection with an embodiment of the invention.

FIG. 1A is a block diagram illustrating an exemplary differential input asymmetric differential output LNA receiving signals from an antenna via a filter and a balun, in connection with an embodiment of the invention. Referring to FIG. 1A, there is shown a portion of an RF receiver that may comprise an antenna 102, a filter 104, a balun 106, and a low noise amplifier (LNA) 108a. The filter 104 may comprise suitable logic, circuitry, and/or code that may enable filtering the signals received via the antenna 102. The balun 106 may comprise suitable logic, circuitry, and/or code that may enable converting the received signals into a differential input for the LNA 108. The LNA 108a may comprise suitable logic, circuitry, and/or code that may enable amplification of the received signals. In this regard, the LNA 108a may generate a differential output for the amplified signals from the differential input received from the balun 106. The differential output generated by the LNA 108a may be asymmetric, for example. In some instances, it may be desirable to implement a substantially similar portion of an RF receiver without the use of the balun 106 in order to reduce the number of components necessary and provide a lower cost solution, for example.

Figure 1B:
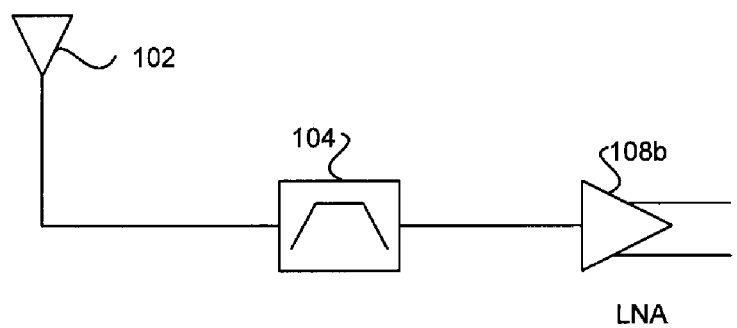
FIG. 1B is a block diagram illustrating an exemplary single-ended input symmetric differential output LNA receiving signals from an antenna via a filter, in connection with an embodiment of the invention.

FIG. 1B is a block diagram illustrating an exemplary single-ended input symmetric differential output LNA receiving signals from an antenna via a filter, in connection with an embodiment of the invention. Referring to FIG. 1B, there is shown a portion of an RF receiver that may comprise the antenna 102, the filter 104, and an LNA 108b. The LNA 108b may comprise suitable logic, circuitry, and/or code that may enable amplification of the received signals. In this regard, the LNA 108b may enable receiving a single ended input signal directly from the filter 104 to generate a differential output. In some instances, it may be desirable that an LNA in an RF receiver may enable receiving a single ended input signal to generate a symmetric differential output signal.

Figure 1C:
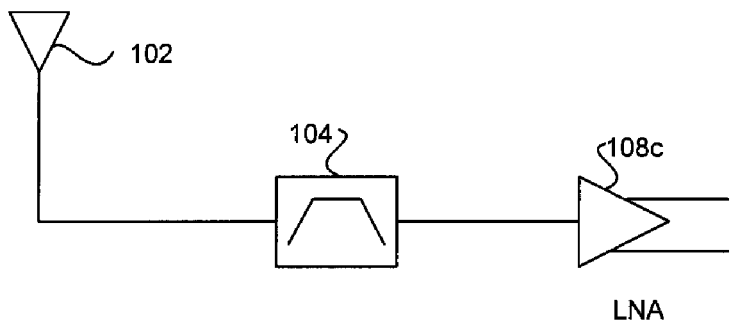
FIG. 1C is a block diagram illustrating an exemplary single-ended input symmetric differential output LNA receiving signals from an antenna via a filter, in accordance with an embodiment of the invention.

FIG. 1C is a block diagram illustrating an exemplary single-ended input symmetric differential output LNA receiving signals from an antenna via a filter, in accordance with an embodiment of the invention. Referring to FIG. 1C, there is shown a portion of an RF receiver that may comprise the antenna 102, the filter 104, and an LNA 108c. The LNA 108c may comprise suitable logic, circuitry, and/or code that may enable amplification of the received signals. In this regard, the LNA 108c may enable receiving a single ended input signal directly from the filter 104 to generate a differential output. The differential output generated by the LNA 108c may be symmetric, for example. Moreover, the LNA 108c may enable low power, noise cancellation operations, high voltage gain, and/or appropriate input matching impedance, for example.

Figure 2:
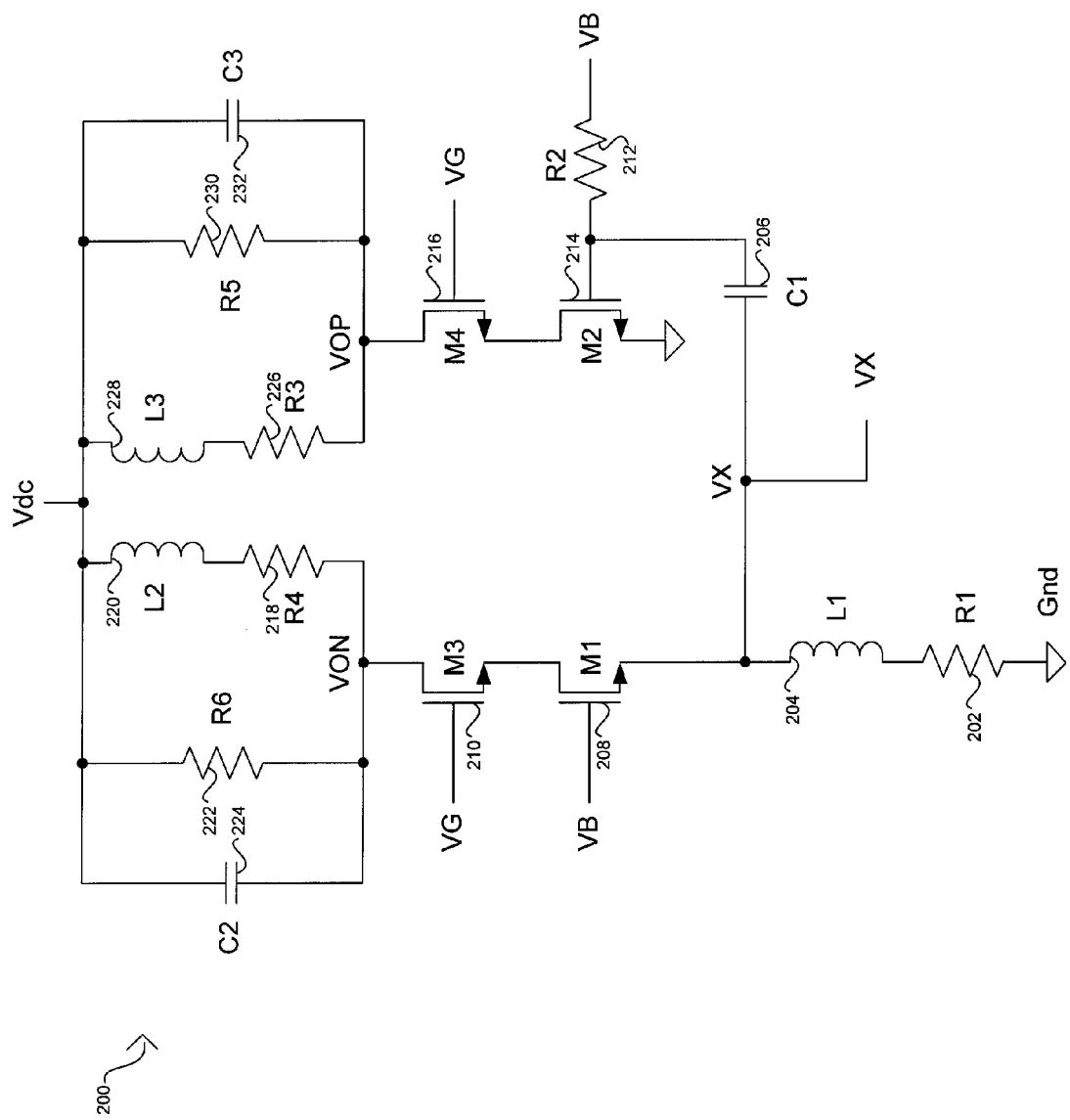
FIG. 2 is a circuit diagram illustrating an exemplary noise cancellation LNA with asymmetric differential output, in accordance with an embodiment of the invention.

FIG. 2 is a circuit diagram illustrating an exemplary noise cancellation LNA with asymmetric differential output, in accordance with an embodiment of the invention. Referring to FIG. 2, there is shown an LNA 200 that may provide noise cancellation operations. The LNA 200 may comprise a plurality of transistors M1 208, M2 214, M3 210, and M4 216, a plurality of resistors R1 202, R2 212, R3 226, R4 218, R5 230, and R6 222, a plurality of capacitors C1 206, C2 224, and C3 232, and a plurality of inductors L1 204, L2 220, and L3 228.

The transistor M1 provides a common gate input impedance with L1 and R1 for the single ended input at VX. The value of R2 may be selected so that the input impedance is substantially determined by M1, L1, and/or R1. For example, the common gate input impedance may be designed to provide input matching for a 50 ohm input. The voltages VG and VB may be utilized to provide appropriate biasing for transistors M3, M4 and M1, M2 respectively. Moreover, a supply (Vdc) and ground (Gnd) voltages are also illustrated.

The differential output generated by the LNA 200 may correspond to the difference between the voltage signals at VON and VOP on the drains of transistors M3 and M4 respectively. In this regard, the voltage signal at VON may be based on the resonant circuit that comprises C2, L2, R4, and R6, for example. Moreover, the voltage signal at VOP may be based on the resonant circuit that comprises C3, L3, R3, and R5. The resonant circuits may be model circuits from the use of two-on chip inductors, for example.

In an exemplary embodiment of the invention, which may be utilized for 50 ohm input impedance, the following component values may be utilized: R1=3.7Ω, L1=1.3 nH, C1=2 pF, R2=20 KΩ, R3=11.5Ω, R5=10 KΩ, L3=4 nH, C3=112 pF, R4=20Ω, R6=4 kΩ, L2=7 nH, and C2=100 fF. In this regard, the on-chip inductors corresponding to the values for C2, L2, R4, R6, C3, L3, R3, and R5 described above may have a Q=12, for example. The noise cancellation approach disclosed in FIG. 2 may utilize high currents, and therefore high power, to generate the appropriate input matching impedance. Moreover, the noise cancellation approach utilized in FIG. 2 may result in the differential output VON-VOP to be asymmetrical.

Figure 3:
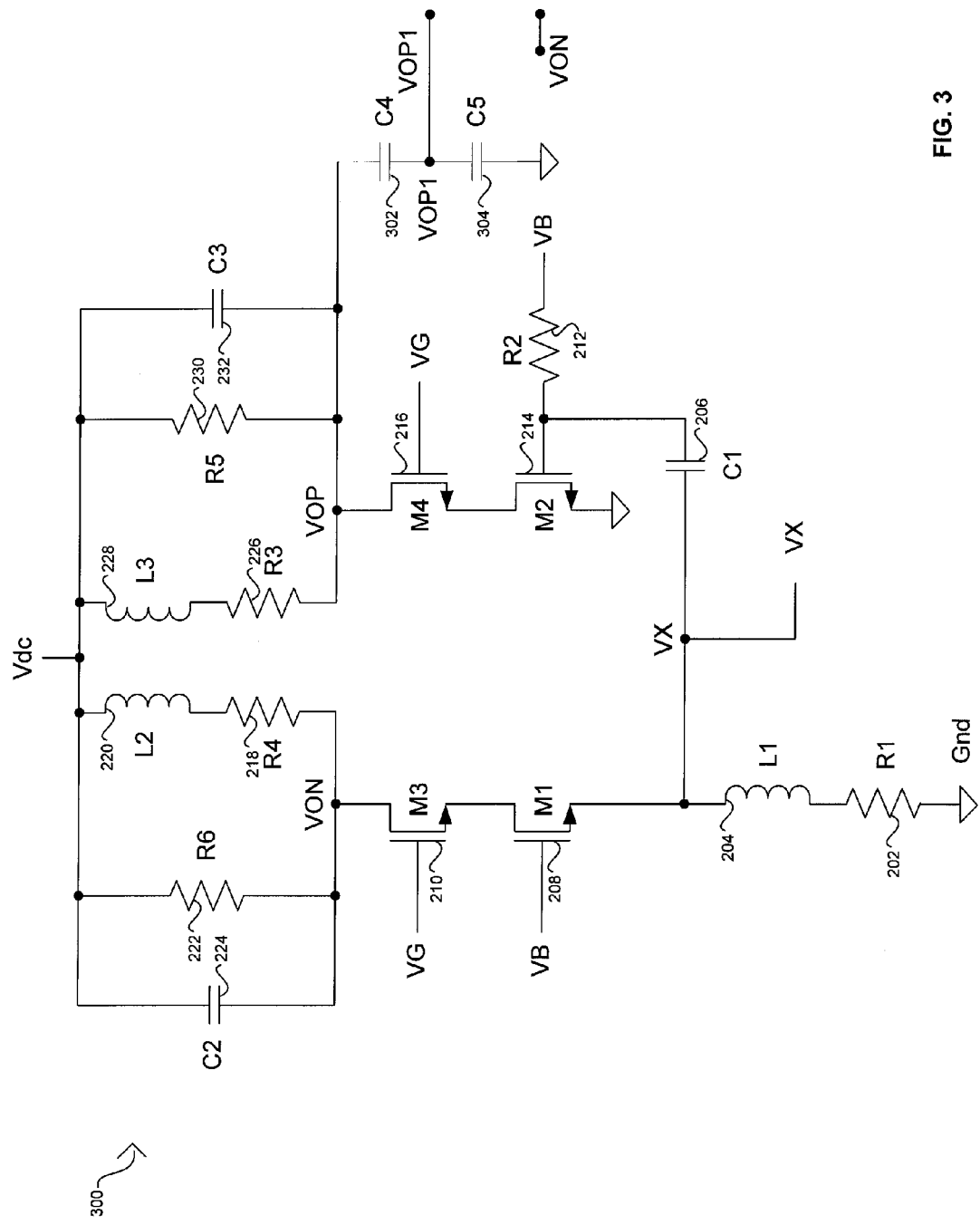
FIG. 3 is a circuit diagram illustrating an exemplary noise cancellation LNA with symmetric differential output that utilizes an output capacitive voltage divider, in accordance with an embodiment of the invention.

FIG. 3 is a circuit diagram illustrating an exemplary noise cancellation LNA with symmetric differential output that utilizes an output capacitive voltage divider, in accordance with an embodiment of the invention. Referring to FIG. 3, there is shown an LNA 300 that may provide noise cancellation operations with a symmetric differential output. The LNA 300 may comprise a plurality of transistors M1 208, M2 214, M3 210, and M4 216, a plurality of resistors R1 202, R2 212, R3 226, R4 218, R5 230, and R6 222, a plurality of capacitors C1 206, C2 224, C3 232, C4 302, and C5 302, and a plurality of inductors L1 204, L2 220, and L3 228.

As disclosed in FIG. 2, the transistor M1 provides a common gate input impedance with L1 and R1 for the single ended input at VX, while the voltages VG and VB may be utilized to provide appropriate biasing for transistors M3, M4 and M1, M2 respectively. The differential output generated by the LNA 300 may correspond to the difference between the voltage signals at VON and VOP1 on the drain of transistor M3 and between C4 and C5 respectively. In this regard, the voltage signal at VON may be based on the resonant circuit that comprises C2, L2, R4, and R6, for example. Moreover, the voltage signal at VOP1 may be based on the resonant circuit that comprises C3, L3, R3, and R5 and the voltage divider that comprises C4 and C5. The voltage divider that comprises C4 and C5 may be implemented based on a capacitor bank, for example. In an exemplary embodiment of the invention, C4=100 fF and C5=50 fF, for example. Notwithstanding the LNA 300 disclosed in FIG. 3, the invention need not be so limited.

The LNA 300 may enable a fully differential output by attenuating one output voltage using a capacitor divider, for example, to match another output voltage level without adding noise. The LNA 300 may also enable receiving a single-ended RF input and generating fully differential and symmetric outputs to eliminate, for example, the need of baluns before and/or after the LNA to reduce the overall noise figure of the RF receiver. The LNA 300 may also enable generating the fully differential symmetric output based on a differential conversion that need not use transformers, for example. Moreover, the approach described herein may enable designs that may require reduced silicon area to implement.

Figure 4:
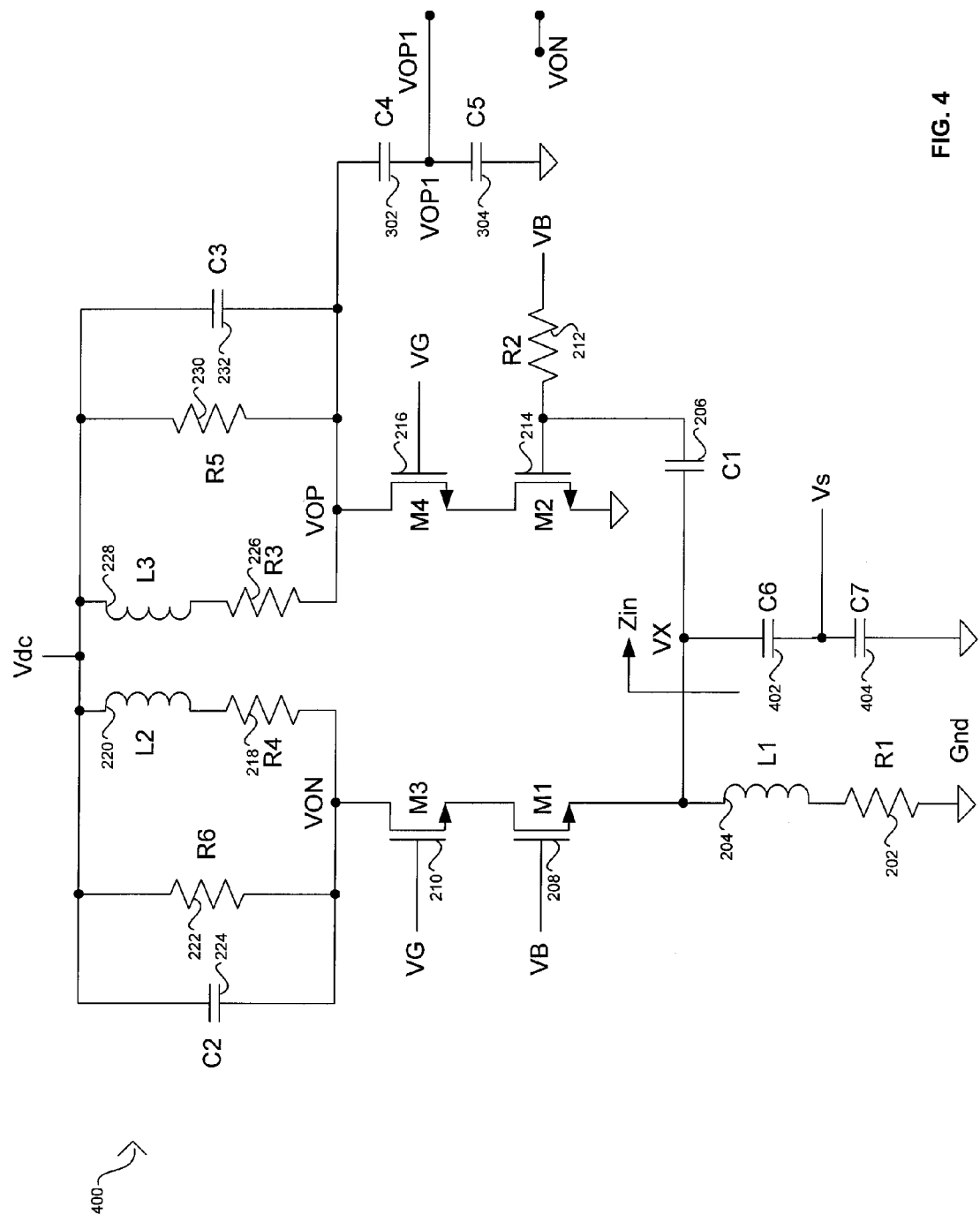
FIG. 4 is a circuit diagram illustrating an exemplary low power noise cancellation LNA with symmetric differential output that utilizes an input capacitive voltage divider, in accordance with an embodiment of the invention.

FIG. 4 is a circuit diagram illustrating an exemplary low power noise cancellation LNA with symmetric differential output that utilizes an input capacitive voltage divider, in accordance with an embodiment of the invention. Referring to FIG. 4, there is shown an LNA 400 that may provide low power noise cancellation operations with a symmetric differential output. The LNA 400 may comprise a plurality of transistors M1 208, M2 214, M3 210, and M4 216, a plurality of resistors R1 202, R2 212, R3 226, R4 218, R5 230, and R6 222, a plurality of capacitors C1 206, C2 224, C3 232, C4 302, C5 302, C6 402, and C7 404, and a plurality of inductors L1 204, L2 220, and L3 228.

In this instance, the input impedance for the single ended input, Vs, may be provided by the common gate implementation of the transistor M1 with L1 and R1 and the voltage divider comprising C6 and C7. The voltage divider that comprises C6 and C7 may be implemented based on a capacitor bank, for example. In an exemplary embodiment of the invention, C6=2 pF and C7=500 fF, for example. The LNA 400 may provide low power noise cancellation operations by transforming the original source impedance, 50 ohms for example, to a higher impedance, such as 78 ohms, for example. Moreover, an additional voltage gain, that in some instances may be of approximately 2 dB, for example, may be obtained from the input network.

As described in FIG. 3, the differential output generated by the LNA 400 may correspond to the difference between the voltage signals at VON and VOP1 on the drain of transistor M3 and between C4 and C5 respectively. In this regard, the voltage signal at VON may be based on the resonant circuit that comprises C2, L2, R4, and R6, for example. Moreover, the voltage signal at VOP1 may be based on the resonant circuit that comprises C3, L3, R3, and R5 and the voltage divider that comprises C4 and C5. The voltage divider that comprises C4 and C5 may be implemented based on a capacitor bank, for example. In an exemplary embodiment of the invention, C4=100 fF and C5=50 fF, for example. Notwithstanding the LNA 400 disclosed in FIG. 4, the invention need not be so limited.

The LNA 400 may enable low power noise cancellation operations. The LNA 400 may also enable a fully differential output by attenuating one output voltage using a capacitor divider, for example, to match another output voltage level without adding noise. The LNA 400 may also enable receiving a single-ended RF input and generating fully differential and symmetric outputs to eliminate, for example, the need of baluns before and/or after the LNA to reduce the overall noise figure of the RF receiver. The LNA 400 may also enable generating the fully differential symmetric output based on a differential conversion that need not use transformers, for example. Moreover, the approach described herein may enable designs that may require reduced silicon area to implement.

Figure 5:
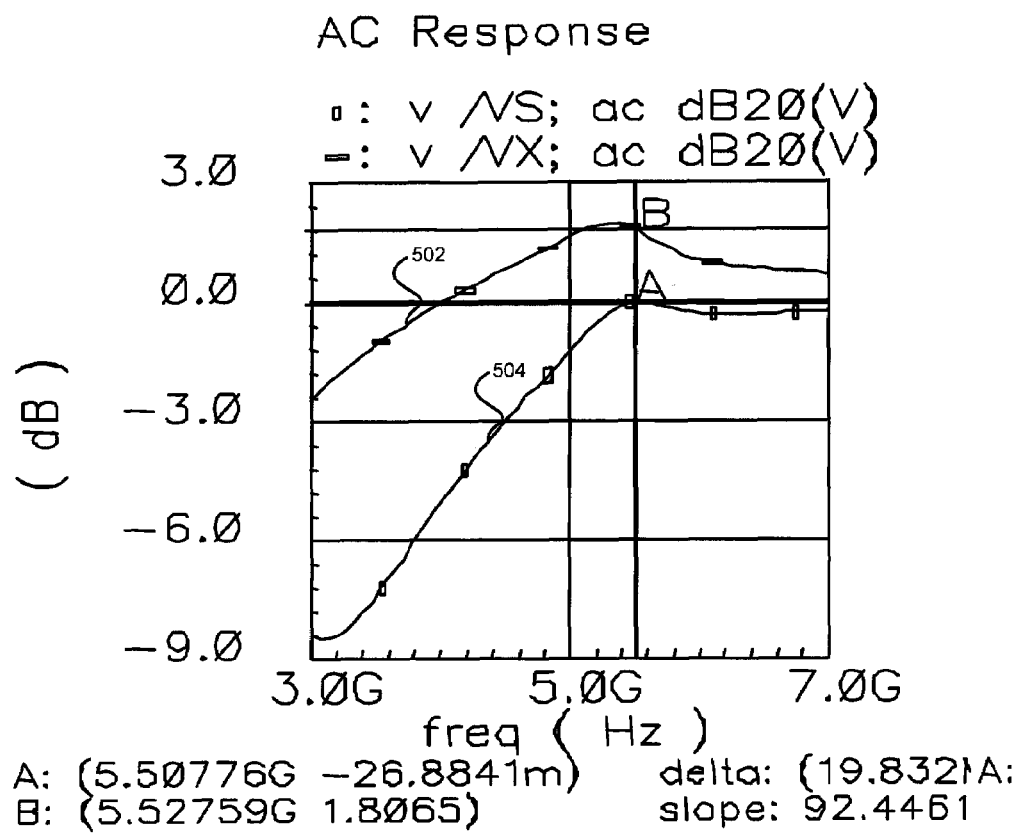
FIG. 5 is a plot illustrating an exemplary input impedance transformation that provides an additional voltage gain of VX/Vs, in accordance with an embodiment of the invention.

FIG. 5 is a plot illustrating an exemplary input impedance transformation that provides an additional voltage gain of VX/Vs, in accordance with an embodiment of the invention. Referring to FIG. 5, there is shown a plot that correspond to the additional voltage gain Av=VX/Vs for an embodiment of the LNA 400 as disclosed in FIG. 4, where a first plot 502 corresponds to the signal voltage at VX and a second plot 504 corresponds to the signal voltage at Vs. The first plot 502 is represented in FIG. 5 by the horizontal squares while the second plot 504 is represented by the vertical squares.

In this exemplary embodiment, the LNA 400 may utilize components with the following values: R1=3.7Ω, L1=1.3 nH, C1=2 pF, R2=20 KΩ, R3=11.5Ω, R5=10 KΩ, L3=4 nH, C3=112 pF, R4=20Ω, R6=4 kΩ, L2=7 nH, C2=100 fF, C4=100 fF, C5=50 fF, C6=2 pF and C7=500 fF. In this regard, the additional voltage gain, Av=VX/Vs, enabled by the low power design may correspond to 1.8 dB at 5.5 GHz, for example. Additional values of VX and Vs for this exemplary embodiment are also shown for the range 3.0 GHz to 7.0 GHz.

Figure 6B:
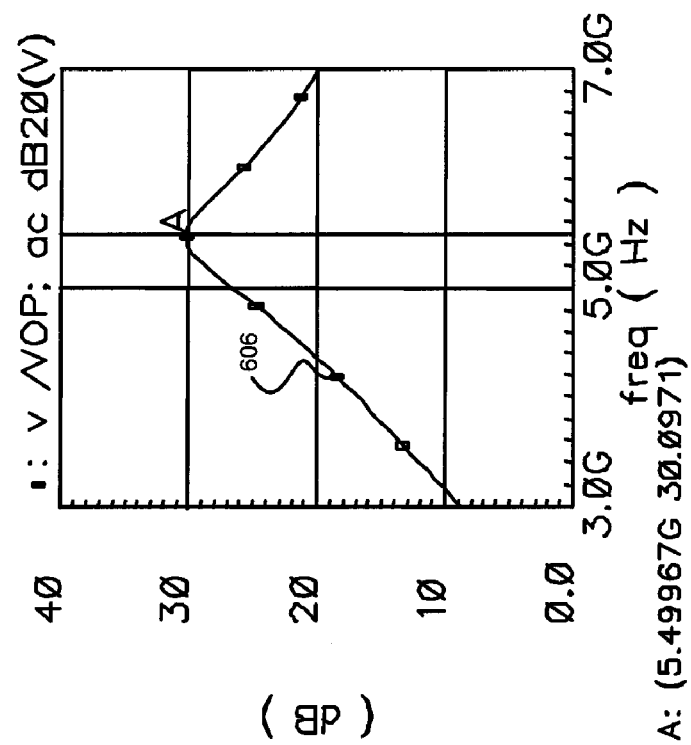
FIG. 6B is a plot illustrating an exemplary differential output response for VOP, in accordance with an embodiment of the invention.
Figure 6A:
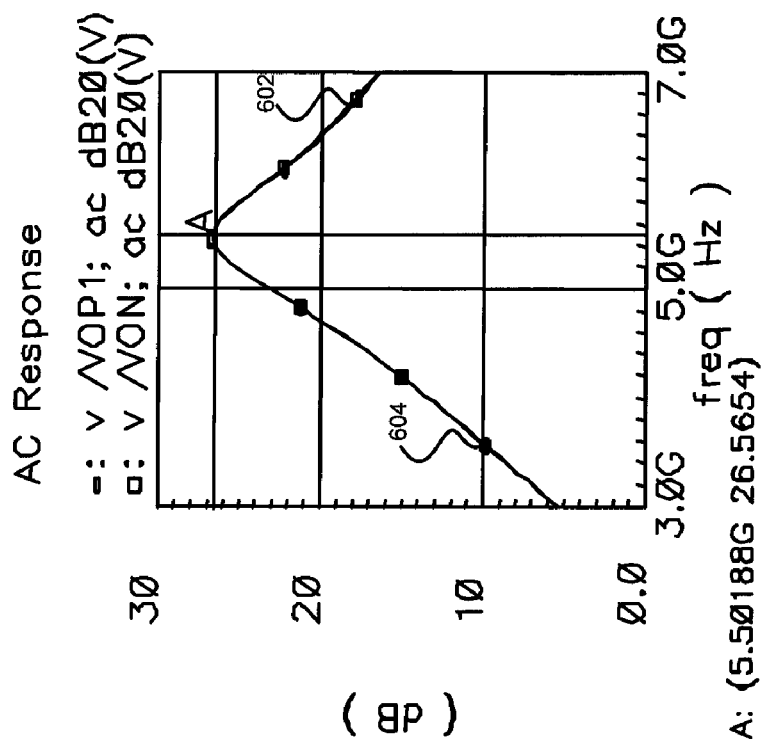
FIG. 6A is a plot illustrating an exemplary differential output response for VON and VOP1 when a capacitive voltage divider is utilized, in accordance with an embodiment of the invention.

FIG. 6A is a plot illustrating an exemplary differential output response for VON and VOP1 when a capacitive voltage divider is utilized, in accordance with an embodiment of the invention. Referring to FIG. 6A, there is shown a first plot 602 and a second plot 604 that correspond to each of the voltage signals of the differential output VON–VOP1 for an embodiment of the LNA 300 as disclosed in FIG. 3 where a voltage divider is utilized to generate a fully differential output. The first plot 602 corresponds to the signal voltage at VOP1 and the second plot 604 corresponds to the signal voltage at VON. The first plot 602 is represented in FIG. 6A by the horizontal squares while the second plot 604 is represented by the vertical squares.

In this exemplary embodiment, the LNA 300 may utilize components with the following values: R1=3.7Ω, L1=1.3 nH, C1=2 pF, R2=20 KΩ, R3=11.5Ω, R5=10 KΩ, L3=4 nH, C3=112 pF, R4=20.0, R6=4 kΩ, L2=7 nH, C2=100 fF, C4=100 fF, and C5=50 fF. In this regard, the plots 602 and 604 that result from this exemplary embodiment of the LNA 300 are substantially symmetrical, that is, they are substantially the same for the range 3.0 GHz to 7.0 GHz provided in FIG. 6A, for example. At 5.5 GHz, for example, both the value of VOP1 and VON are 26.5 dB, for example.

FIG. 6B is a plot illustrating an exemplary differential output response for VOP, in accordance with an embodiment of the invention. Referring to FIG. 6B, there is shown a plot 606 that correspond to the voltage signal VOP of the differential output VON-VOP for an embodiment of the LNA 300 as disclosed in FIG. 3 where a voltage divider is utilized to generate a fully differential output. The plot 606 is represented in FIG. 6B by vertical squares. In this exemplary embodiment, the LNA 300 may utilize components with values similar to those described in FIG. 6A. Comparison of the plot 604 for VON in FIG. 6A with the plot 606 for VOP in FIG. 6B illustrates that for the range 3.0 GHz to 7.0 GHz the differential output is asymmetric, that is, the values for VON and VOP are different. For example, at 5.5 GHz, the value for VON is 26.5 dB while the value for VOP is 30.1 dB.

The approach described herein may be utilized in LNAs in high performance receivers to operate at low power, to perform low noise amplification, to provide reasonably high voltage gain, and to provide good input impedance matching. In this regard, embodiments of the invention may enable achieving these benefits while being able to generate fully differential output signals that may be easily utilized by subsequent processing portions of the receiver and which may enable designs that need not utilize baluns before and/or after the LNA.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
  receiving signals via a single ended input of a noise cancellation low noise amplifier (NC LNA); and
  generating an amplified symmetric differential output via said NC LNA from said received signals, wherein a first differential portion of said amplified symmetric differential output is generated via a voltage divider.

2. The method according to claim 1, comprising voltage dividing said received signals in said single ended input via a plurality of capacitors.

3. The method according to claim 2, wherein said plurality of capacitors is a capacitor bank.

4. The method according to claim 1, wherein said voltage divider comprises a plurality of capacitors.

5. The method according to claim 4, wherein said plurality of capacitors is a capacitor bank.

6. The method according to claim 1, wherein said single ended input matches an input port impedance.

7. A system for signal processing, the system comprising:
  a noise cancellation low noise amplifier (NC LNA) that receives signals via a single ended input; and
  said NC LNA generates an amplified symmetric differential output from said received signals, wherein said NC LNA comprises a voltage divider and a first differential portion of said amplified symmetric differential output is generated via said voltage divider.

8. The system according to claim 7, wherein said NC LNA voltage divides said received signals in said single ended input via a plurality of capacitors.

9. The system according to claim 8, wherein said plurality of capacitors is a capacitor bank.

10. The system according to claim 7, wherein said voltage divider comprises a plurality of capacitors.

11. The system according to claim 10, wherein said plurality of capacitors is a capacitor bank.

12. The system according to claim 7, wherein said single ended input matches an input port impedance.

13. A system for signal processing, the system comprising:
  one or more circuits that provide noise cancellation low noise amplification of signals received via a single ended input; and
  said one or more circuits generate an amplified symmetric differential output from said received signals, wherein said one or more circuits comprise a voltage divider and a first differential portion of said amplified symmetric differential output is generated via said voltage divider.

14. The system according to claim 13, wherein said one or more circuits voltage divide said received signals in said single ended input via a plurality of capacitors.

15. The system according to claim 14, wherein said plurality of capacitors is a capacitor bank.

16. The system according to claim 13, wherein said voltage divider comprises a plurality of capacitors.

17. The system according to claim 16, wherein said plurality of capacitors is a capacitor bank.

18. The system according to claim 13, wherein said single ended input matches an input port impedance.

* * * * *